US010529709B2

(12) United States Patent
Tadokoro et al.

(10) Patent No.: US 10,529,709 B2
(45) Date of Patent: Jan. 7, 2020

(54) SILICON CARBIDE SEMICONDUCTOR DEVICE HAVING HIGH BREAKDOWN VOLTAGE AND LOW ON RESISTANCE

(71) Applicant: Mitsubishi Electric Corporation, Tokyo (JP)

(72) Inventors: Chihiro Tadokoro, Tokyo (JP); Kensuke Taguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/777,674

(22) PCT Filed: Jan. 5, 2016

(86) PCT No.: PCT/JP2016/050159
§ 371 (c)(1),
(2) Date: May 21, 2018

(87) PCT Pub. No.: WO2017/119066
PCT Pub. Date: Jul. 13, 2017

(65) Prior Publication Data
US 2018/0337175 A1    Nov. 22, 2018

(51) Int. Cl.
| H01L 27/08 | (2006.01) |
| H01L 29/16 | (2006.01) |
| H01L 29/06 | (2006.01) |
| H01L 29/872 | (2006.01) |

(52) U.S. Cl.
CPC ...... H01L 27/0814 (2013.01); H01L 29/0634 (2013.01); H01L 29/1608 (2013.01); H01L 29/872 (2013.01)

(58) Field of Classification Search
CPC ............ H01L 27/0814; H01L 29/1608; H01L 29/872; H01L 29/0634
See application file for complete search history.

(56) References Cited

U.S. PATENT DOCUMENTS 6,313,482 B1 * 11/2001 Baliga ................. H01L 29/0619
257/77
7,791,138 B2 * 9/2010 Pfirsch ................ H01L 29/0634
257/337
(Continued)

FOREIGN PATENT DOCUMENTS

| JP | H09-008332 A | 1/1997 |
| JP | 2002-261295 A | 9/2002 |

(Continued)

OTHER PUBLICATIONS

Notification of Transmittal of Translation of the International Preliminary Report on Patentability (Chapter I) and Translation of Written Opinion of the International Searching Authority; PCT/JP2016/050159; dated Jul. 19, 2018.
(Continued)

*Primary Examiner* — Robert K Carpenter
(74) *Attorney, Agent, or Firm* — Studebaker & Brackett PC

(57) ABSTRACT

A silicon carbide substrate is provided with a first surface and a second surface opposite the first surface. The silicon carbide substrate includes an n-type region connecting the first surface and the second surface, and a p-type region being in contact with the first surface and connecting the first surface and the second surface. A first anode electrode is Schottky-joined, on the first surface, to the n-type region. A first cathode electrode is ohmically joined, on the second surface, to the n-type region. A second anode electrode is ohmically joined, on the first surface, to the p-type region. A second cathode electrode is Schottky-joined, on the second surface, to the p-type region.

4 Claims, 3 Drawing Sheets

(56) References Cited

U.S. PATENT DOCUMENTS

| | | |
|---|---|---|
| 2002/0020893 A1 | 2/2002 | Lhorte |
| 2006/0237813 A1* | 10/2006 | Hshieh .................. H01L 29/402 257/475 |
| 2008/0191305 A1* | 8/2008 | Khemka ............ H01L 29/0634 257/481 |
| 2009/0108303 A1* | 4/2009 | Pfirsch ............... H01L 29/0634 257/287 |
| 2012/0223332 A1* | 9/2012 | Kamaga ................ H01L 29/063 257/77 |
| 2014/0239435 A1* | 8/2014 | Qu .................... H01L 29/66143 257/476 |

FOREIGN PATENT DOCUMENTS

| | | |
|---|---|---|
| JP | 2007-042997 A | 2/2007 |
| JP | 2010-199480 A | 9/2010 |
| JP | 2012-182405 A | 9/2012 |
| JP | WO 2013/161116 | * 10/2013 |
| WO | 2013/161116 A1 | 10/2013 |

OTHER PUBLICATIONS

International Search Report issued in PCT/JP2016/050159; dated Apr. 12, 2016.
An Office Action mailed by the Japanese Patent Office dated Sep. 11, 2018, which corresponds to Japanese Patent Application No. 2017-559963 and is related to U.S. Appl. No. 15/777,674.

* cited by examiner

F I G . 5
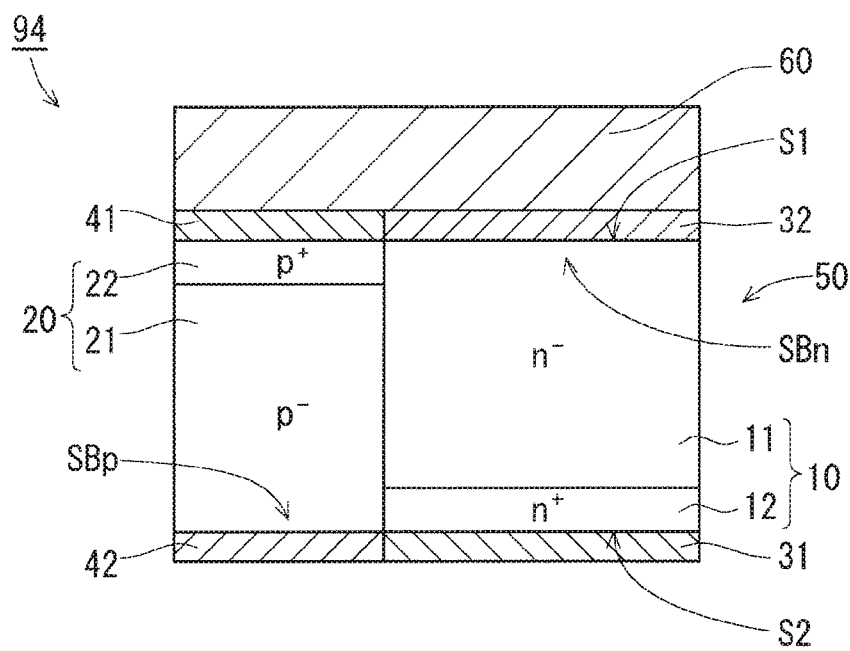
F I G . 6
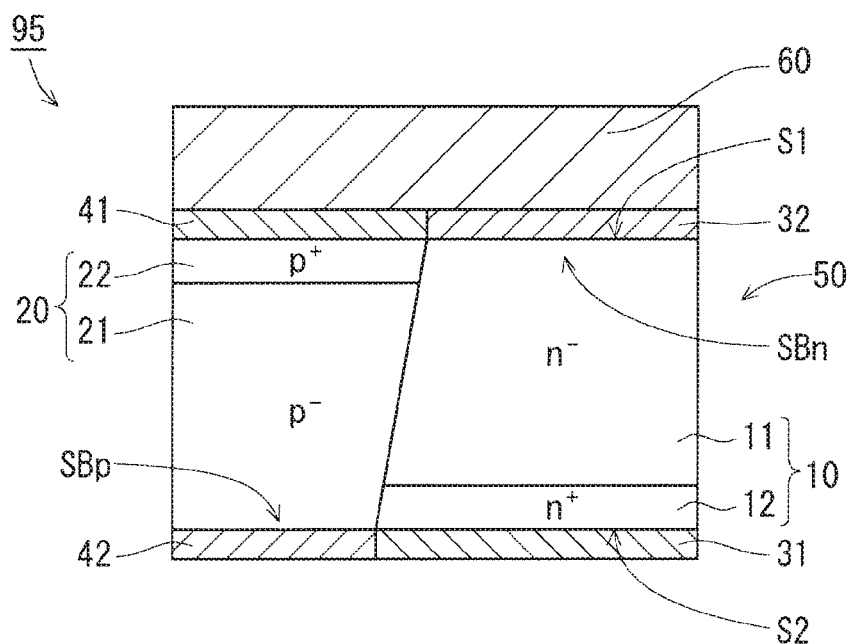

SILICON CARBIDE SEMICONDUCTOR DEVICE HAVING HIGH BREAKDOWN VOLTAGE AND LOW ON RESISTANCE

TECHNICAL FIELD

The present invention relates to silicon carbide semiconductor devices, and particularly, to a silicon carbide Schottky junction semiconductor device.

BACKGROUND ART

A pn junction diode made of silicon (Si) has been widely used. This diode relatively easily achieves a high withstand voltage and a low forward voltage. The diode, unfortunately, has a low switching-speed. Accordingly, as a diode having a higher switching-speed, a Schottky barrier diode (SBD) using silicon carbide as a semiconductor material has begun to be used. A typical SBD has a relatively simple main part as disclosed in, for instance, Japanese Patent Application Laid-Open No. 2002-261295 (Patent Document 1). To be specific, the main part of the SBD includes an substrate, an n-type buffer layer, an n-type drift layer, a Schottky electrode, and an ohmic electrode. The Schottky electrode is disposed on the n-type drift layer as an anode electrode. The ohmic electrode is disposed on the n+ substrate as a cathode electrode.

PRIOR ART DOCUMENT

Patent Document

Patent Document 1: Japanese Patent Application Laid-Open No. 2002-261295

SUMMARY

Problem to Be Solved by the Invention

For semiconductor devices, and particularly, for power semiconductor devices, a reduction in power loss is an important problem. In particular, a reduction in forward voltage is the key to a reduction in power loss of the SBD. The SBD of the above document, which has a relatively simple main part, has a limited typical method for regulating its forward voltage. Specifically, such a typical method is increasing the carrier concentration of the n-type drift layer or reducing the thickness of the n-type drift layer. Unfortunately, the reduction in forward voltage involves a reduction in withstand voltage of the SBD in either way.

The present invention has been made to solve the aforementioned problem. It is an object of the present invention to provide a silicon carbide semiconductor device that achieves a more reduction in its forward voltage while having a sufficient withstand voltage.

Means to Solve the Problem

A silicon carbide semiconductor device according to the present invention includes a silicon carbide substrate, a first anode electrode, a first cathode electrode, a second anode electrode, and a second cathode electrode. The silicon carbide substrate is provided with a first surface and a second surface opposite the first surface. The silicon carbide substrate includes an n-type region connecting the first surface and the second surface, and a p-type region being in contact with the first surface and connecting the first surface and the second surface. The first anode electrode is Schottky-joined, on the first surface, to the n-type region. The first cathode electrode is ohmically joined, on the second surface, to the n-type region. The second anode electrode is ohmically joined, on the first surface, to the p-type region. The second cathode electrode is Schottky-joined, on the second surface, to the p-type region.

Effects of the Invention

According to the present invention, the silicon carbide semiconductor device achieves a more reduction in its forward voltage while having a sufficient withstand voltage.

These and other objects, features, aspects and advantages of the present invention will become more apparent from the following detailed description of the present invention when taken in conjunction with the accompanying drawings.

BRIEF DESCRIPTION OF DRAWINGS

FIG. 5 is a schematic cross-sectional view of a configuration of a silicon carbide device according to a fourth embodiment of the present invention.

FIG. 6 is a schematic cross-sectional view of a configuration of a silicon carbide device according to a fifth embodiment of the present invention.

DESCRIPTION OF EMBODIMENT(S)

The following describes the embodiments of the present invention with reference to the accompanying drawings.

(First Embodiment)

Figure 1:
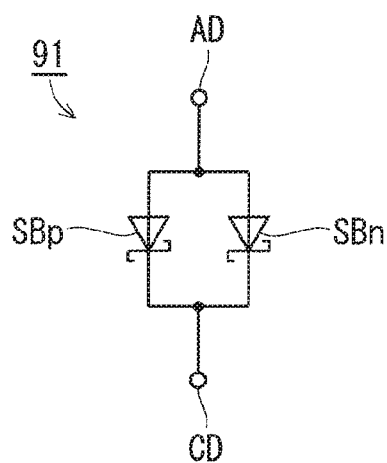
FIG. 1 is a schematic diagram illustrating a configuration of an equivalent circuit of a silicon carbide device according to a first embodiment of the present invention.

FIG. 1 is a schematic diagram illustrating a configuration of an equivalent circuit of a diode 91 (silicon carbide semiconductor device) according to a first embodiment. The equivalent circuit of the diode 91 includes an anode terminal AD, a cathode terminal CD, a Schottky barrier diode SBp, and a Schottky barrier diode SBn. The Schottky barrier diode SBp and the Schottky barrier diode SBn each have an anode side connected to the anode terminal AD. The Schottky barrier diode SBp and the Schottky barrier diode SBn each have a cathode side connected to the cathode terminal AD. In other words, the Schottky barrier diode SBp and the Schottky barrier diode SBn are connected in parallel to each other in the same forward direction.

Figure 2:
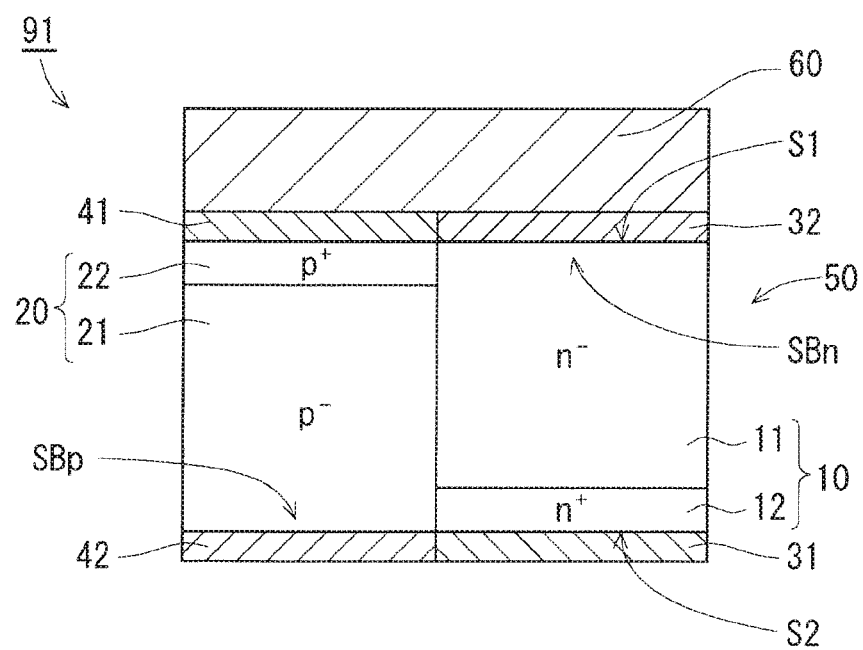
FIG. 2 is a schematic cross-sectional view of a configuration of the silicon carbide device according to the first embodiment of the present invention.

FIG. 2 is a schematic cross-sectional view of a configuration of the diode 91. The diode 91 includes a silicon carbide substrate 50, a first anode electrode 32, a first cathode electrode 31, a second anode electrode 41, a second cathode electrode 42, and a common anode electrode 60. The silicon carbide substrate 50 is provided with a first surface S1, and a second surface S2 opposite the first surface S1. The first surface S1 and the second surface S2 are substantially parallel to each other. The silicon carbide substrate 50 includes an n-type region 10 and a p-type region 20.

The n-type region 10 connects the first surface S1 and the second surface S2. The n-type region 10 includes an n$^-$ region 11 and an n$^+$ region 12. The n$^+$ region 12 has a higher impurity concentration than the n$^-$ region 11. The n$^-$ region 11 is disposed on the first surface S1. The n$^+$ region 12 is disposed on the second surface S2.

The p-type region 20 connects the first surface S1 and the second surface S2. The p-type region 20 includes a p$^-$ region 21 and a p$^+$ region 22. The p$^+$ region 22 has a higher impurity concentration than the p$^-$ region 21. The p$^-$ region 21 is disposed on the second surface S2. The p$^+$ region 22 is disposed on the first surface S1.

The p-type region 20 is in contact with the n-type region 10. To be specific, the p$^-$ region 21 is in contact with the n$^-$ region 11. This establishes a pn junction between the n-type region 10 and the p-type region 20. This pn junction extends in a direction in which the pn junction intersects each of the first surface S1 and the second surface S2 (i.e., an up-and-down direction of the pn junction in FIG. 2). Accordingly, the diode 91 has a super-junction structure, The first anode electrode 32 is a Schottky electrode, and is Schottky-joined, on the first surface S1, to the n$^-$ region 11 of the n-type region 10. The first anode electrode 32 is a conductor layer containing a first metal element such as titanium (Ti). An example of the first anode electrode 32 is a Ti layer. The second anode electrode 41 is an ohmic electrode, and is ohmically joined, on the first surface S1, to the p$^+$ region 22 of the p-type region 20. The second anode electrode 41 is preferably separated from the n-type region 10. The second anode electrode 41 is preferably silicided on the first surface S1 for a good ohmic-junction. The anode electrode 41 may contain a second metal element different from the first metal element, and may contain platinum (Pt) for instance. An example of the second anode electrode 41 is a Pt layer.

The common anode electrode 60 is in contact with the first anode electrode 32 and the second anode electrode 41. Accordingly, the common anode electrode 60 functions as the anode terminal AD (FIG. 1). The first anode electrode 32 and the second anode electrode 41 may be in contact with each other. In this case, each of the first anode electrode 32 and the second anode electrode 41 functions as the anode terminal AD. Accordingly, the common anode electrode 60 can be omitted.

The first cathode electrode 31 is an ohmic electrode, and is ohmically joined, on the second surface S2, to the n$^+$ region 12 of the n-type region 10. The first cathode electrode 31 is preferably separated from the p-type region 20. The first cathode electrode 31 is preferably silicided on the second surface S2 for a good ohmic-junction. The second cathode electrode 42 is a Schottky electrode, and is Schottky-joined, on the second surface S2, to the p-type region 20. The first cathode electrode 31 and the second cathode electrode 42 may contain a common metal element. For instance, the first cathode electrode 31 may be a nickel (Ni) layer silicided on the second surface S2, and the second cathode electrode 42 may be a Ni layer. The first cathode electrode 31 and the second cathode electrode 42 may be connected to each other.

The aforementioned Schottky electrode can be formed through the following processes: forming a layer to be a Schottky electrode; and heating the layer for sintering. Further, the aforementioned ohmic electrode can be formed through the following processes: forming a layer to be an ohmic electrode; and heating the layer for siliciding. The heating process for sintering is performed at a lower temperature than the heating process for siliciding. For instance, the former is performed at about 400° C.; and the latter, at about 1100° C. The process of heating the layer to be a Schottky electrode for sintering may be performed with respect to both the layer to be a Schottky electrode and the layer to be an ohmic electrode. On the other hand, the process of heating the layer to be an ohmic electrode for siliciding is performed only with respect to the layer to be an ohmic electrode, and is not performed with respect to the layer to be a Schottky electrode.

According to the present embodiment, the pn junction between the n-type region 10 and the p-type region 20 establishes the super-junction structure. This enables a depletion layer to extend also in a transverse direction (i.e., a direction orthogonal to a direction of the thickness of the silicon carbide substrate 50) when a reverse voltage is applied across the diode 91. Consequently, the diode 91 has a sufficient withstand voltage even if the n-type region 10 as a drift layer (i.e., the n$^-$ region 11) and the p-type region 20 as a drift layer (i.e., the p$^-$ region 21) are set to have high impurity concentrations to a certain degree. Such high impurity concentrations reduce the resistances (differential resistances) of the drift layers with respect to a forward current. Further, the n-type region 10 and the p-type region 20 (F1G. 2) constitute the Schottky barrier diode SBn and the Schottky barrier diode SBp (FIG. 1), respectively. Consequently, the diode 91 has a wide area for its practical function, i.e., a wide effective area when compared to a diode in which one of an n-type region and a p-type region forms a Schottky barrier diode. This enables a reduction in forward voltage. As a result, the diode 91 in the present embodiment achieves a reduction in forward voltage while securing a withstand voltage.

The second anode electrode 41 may contain the second metal element different from the first metal element contained in the first anode electrode 32. In this case, the physical properties of a material of the first anode electrode that needs to be Schottky-joined with an n-type semiconductor are more optimized; so are the physical properties of a material of the second anode electrode that needs to be ohmically joined with the n-type semiconductor.

The first cathode electrode 31 and the second cathode electrode 42 may contain the common metal element. In this case, processing steps for forming the first cathode electrode 31 and the second cathode electrode 42 are simplified. To be specific, depositing steps for forming the first cathode electrode 31 and the second cathode electrode 42 are performed in a collective manner.

The following second to fifth embodiments achieve effects similar to those described above. Accordingly, the similar effects will not be elaborated upon in the other embodiments.

The diode 91 in the present embodiment is configured such that the first anode electrode 32 and the second anode electrode 41 are short-circuited to each other, and that the first cathode electrode 31 and the second cathode electrode 42 are short-circuited to each other. Nevertheless, these short-circuits are required to be established when the diode 91 is used. The first anode electrode 32 and the second anode electrode 41, which are disposed on the same first surface S1 of the same silicon carbide substrate 50, are easy to be short-circuited. Moreover, the first cathode electrode 31 and the second cathode electrode 42, which are disposed on the same second surface S2 of the same silicon carbide substrate 50, are easy to be short-circuited. For instance, these electrodes separated from each other can be short-circuited to each other when disposed on a common conductor. Alternatively, these electrodes are short-circuited to each other when electrically bonded to a common conductor. Therefore, as a modification of the diode 91, the first anode electrode 32 and the second anode electrode 41 that are separated from each other may be provided without the common anode electrode 60. Instead or at the same time, the first cathode electrode 31 and the second cathode electrode 42 that are separated from each other may be provided. The same holds true for the other embodiments.

(Second Embodiment)

Figure 3:
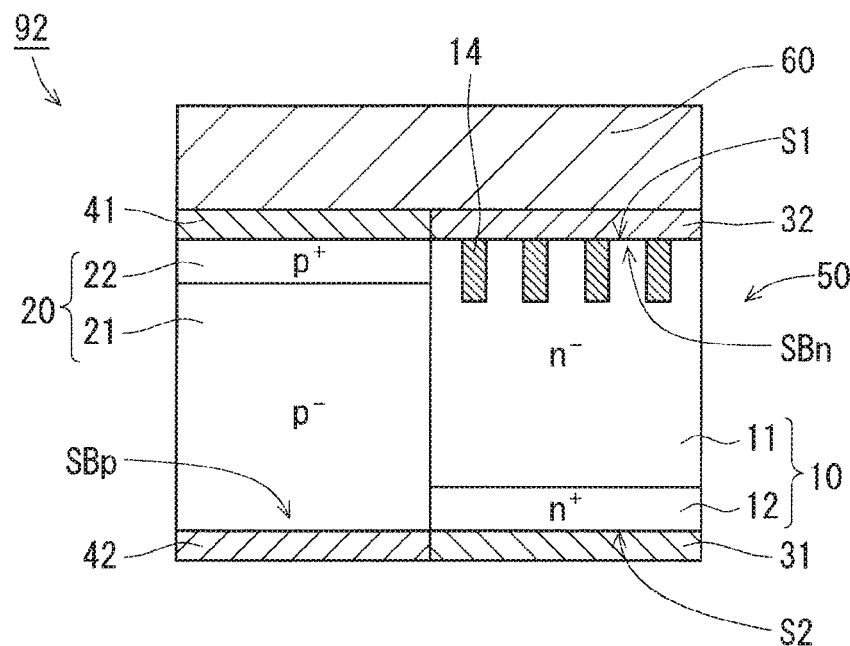
FIG. 3 is a schematic cross-sectional view of a configuration of a silicon carbide device according to a second embodiment of the present invention.

FIG. 3 is a schematic diagram illustrating a configuration of a diode 92 (silicon carbide semiconductor device) according to a second embodiment. The diode 92 includes p-type wells 14 within the silicon carbide substrate 50. The p-type wells 14 partly form the first surface S1 on the n⁻ region 11 of the n-type region 10. Thus, the first anode electrode 32 is in contact with the p-type wells 14 as well as the n⁻ region 11. The p-type wells 14 each can be formed on the n⁻ region 11 of the n-type region 10 through selective implantation of an impurity by the use of an implanting mask. Each p-type well 14 may have an impurity concentration profile in a depth direction similar to that of the p⁺ region 22. In this case, the p-type wells 14 and the p⁺ region 22 can be formed in a collective manner.

The other configurations are almost the same as those described in the first embodiment. Thus, identical or corresponding components are denoted by identical reference symbols, and will not be elaborated upon here.

In the present embodiment, when a large forward current $I_F$ is supplied to the diode 92, a current also flows not only via the Schottky junction between the first anode electrode 32 and the n⁻ region 11 but also via the p-type wells 14. Consequently, the diode 92 has a more reduced forward voltage $V_F$ when supplied with a large current than the diode 91. This increases a capacity of $I^2t$ (inrush current capacity) determined by $I_F \times V_F$.

(Third Embodiment)

Figure 4:
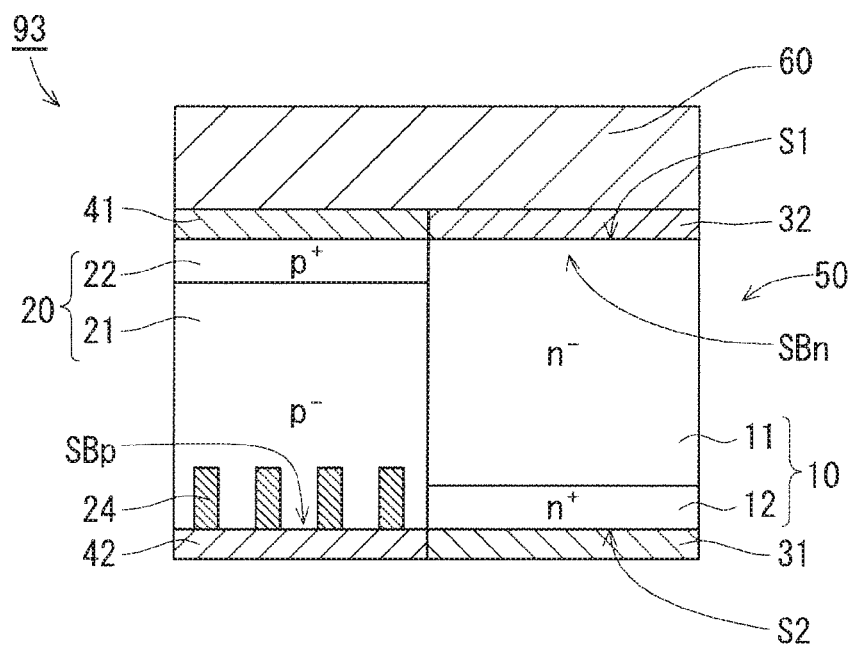
FIG. 4 is a schematic cross-sectional view of a configuration of a silicon carbide device according to a third embodiment of the present invention.

FIG. 4 is a schematic diagram illustrating a configuration of a diode 93 (silicon carbide semiconductor device) according to a third embodiment. The diode 93 includes n-type wells 24 within the silicon carbide substrate 50. The n-type wells 24 each partly form the second surface S2 on the p⁻ region 21 of the p-type region 20. Thus, the second cathode electrode 42 is in contact with the n-type wells 24 as well as the p⁻ region 21. The n-type wells 24 each can be formed on the p⁻ region 21 of the p-type region 20 through selective implantation of an impurity by the use of an implanting mask. Each n-type well 24 may have an impurity concentration profile in a depth direction similar to that of the n⁺ region 12. In this case, the n-type wells 24 and the n⁺ region 12 can be formed in a collective manner.

The other configurations are almost the same as those described in the first embodiment. Thus, identical or corresponding components are denoted by identical reference symbols, and will not be elaborated upon here.

In the present embodiment, when a large forward current $I_F$ is supplied to the diode 93, a current also flows not only via the Schottky junction between the second cathode electrode 42 and the p⁻ region 21 but also via the n-type wells 24. Consequently, the diode 93 has a more reduced forward voltage $V_F$ when supplied with a large current than the diode 91. This increases a capacity of $I^2t$ (inrush current capacity) determined by $I_F \times V_F$.

The p-type wells 14 (FIG. 3: the second embodiment) may be provided in addition to the n-type wells 24 (FIG. 4). In this case, the aforementioned effect is further enhanced.

(Fourth Embodiment)

FIG. 5 is a schematic diagram illustrating a configuration of a diode 94 (silicon carbide semiconductor device) according to a fourth embodiment. The diode 94 is configured such that the p-type region 20 has a smaller width than the n-type region 10 (the size in a transverse direction of the drawing, i.e., the size in a direction orthogonal to a direction of the thickness of the p-type region 20). As a result of this configuration, the p-type region 20 can have a smaller area than the n-type region 10 in plan view. In other words, the p-type region 20 has a smaller effective area than the n-type region 10.

Nevertheless, it is preferable that the width of the p-type region 20 be not small to an excessive degree. To be specific, the width of the p-type region 20 is preferably greater than a distance by which a depletion layer extends across the p⁻ region 21 when the diode 94 is reverse-biased, and is more preferably about three times as large as this distance in view of variations.

The other configurations are almost the same as any of those described in the first to third embodiments. Thus, identical or corresponding components are denoted by identical reference symbols, and will not be elaborated upon here.

According to the present embodiment, the p-type region 20 has a smaller width than the n-type region 10. Accordingly, as carriers for the operation of the diode 94, electrons, which has a high mobility, make up a great proportion than holes, which has a low mobility. Consequently, the carries are rapidly removed during the recovery of the diode 94. This reduces a loss of the recovery.

(Fifth Embodiment)

FIG. 6 is a schematic diagram illustrating a configuration of a diode 95 (silicon carbide semiconductor device) according to a fifth embodiment. The diode 95 is configured such that the second anode electrode 41 has a larger area than the second cathode electrode 42. The other configurations are almost the same as those described in any of the first to third embodiments. Thus, identical or corresponding components are denoted by identical reference symbols, and will not be elaborated upon here.

In the present embodiment, an ohmic-contact region between the p⁺ region 22 of the p-type region 20 and the second anode electrode 41 is wider than a Schottky-contact region between the region 21 of the p-type region 20 and the second cathode electrode 42. The wider ohmic-contact region enables carriers to be quickly removed during the recovery of the diode 95. This reduces a loss of the recovery.

The second cathode electrode 42 may have a smaller area than the first anode electrode 32. In this case, the loss of the recovery is reduced by an effect similar to that described in the fourth embodiment.

It is noted that in the present invention, the individual embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

AD anode terminal, CD cathode terminal, S1 first surface, S2 second surface, SBn, SBp Schottky barrier diode, 10 n-type region, 11 n⁻ region, 12 n⁺ region, 14 p-type well, 20 p-type region, 21 p⁻ region, 22 p⁺ region, 24 n-type well, 31 first cathode electrode, 32 first anode electrode, 41 second anode electrode, 42 second cathode electrode, 50 silicon carbide substrate, 60 common anode electrode, and 91-95 diode (silicon carbide semiconductor device).

The invention claimed is:

1. A silicon carbide semiconductor device comprising:
   a silicon carbide substrate being provided with a first surface and a second surface opposite the first surface, having an n-type region connecting the first surface and the second surface, and having a p-type region being in contact with the n-type region and connecting the first surface and the second surface;
   a first anode electrode that is Schottky-joined, on the first surface, to the n-type region;
   a first cathode electrode that is ohmically joined, on the second surface, to the n-type region;
   a second anode electrode that is ohmically joined, on the first surface, to the p-type region;
   a second cathode electrode that is Schottky-joined, on the second surface, to the p-type region, and
   a p-type well partly forming the first surface on the n-type region, wherein
   a width of the p-type region tapers from the first surface to the second surface, and a width of the n-type region tapers from the second surface to the first surface.

2. The silicon carbide semiconductor device according to claim 1, wherein the second anode electrode has a larger area than the second cathode electrode.

3. The silicon carbide semiconductor device according to claim 1, wherein
   a width of the p-type region increases over an entire length between the first surface and the second surface, and a width of the n-type region correspondingly decreases over an entire length between the first surface and the second surface.

4. A silicon carbide semiconductor device comprising:
   a silicon carbide substrate being provided with a first surface and a second surface opposite the first surface, having an n-type region connecting the first surface and the second surface, and having a p-type region being in contact with the n-type region and connecting the first surface and the second surface;
   a first anode electrode that is Schottky-joined, on the first surface, to the n-type region;
   a first cathode electrode that is ohmically joined, on the second surface, to the n-type region;
   a second anode electrode that is ohmically joined, on the first surface, to the p-type region;
   a second cathode electrode that is Schottky-joined, on the second surface, to the p-type region, and
   a plurality of p-type wells disposed beneath the first surface within the n-type region, wherein
   the p-type region has a smaller width than the n-type region.

* * * * *